US012740211B2

(12) United States Patent
Leber et al.

(10) Patent No.: US 12,740,211 B2
(45) Date of Patent: Sep. 15, 2026

(54) COMPONENT WITH IMPROVED CONNECTION STRUCTURE AND METHOD FOR PRODUCING A COMPONENT

(71) Applicant: ams-OSRAM International GmbH, Regensburg (DE)

(72) Inventors: Andreas Leber, Regensburg (DE); Christine Rafael, Weil Am Rhein (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 488 days.

(21) Appl. No.: 18/044,210

(22) PCT Filed: Aug. 6, 2021

(86) PCT No.: PCT/EP2021/072058
§ 371 (c)(1),
(2) Date: Mar. 7, 2023

(87) PCT Pub. No.: WO2022/053236
PCT Pub. Date: Mar. 17, 2022

(65) Prior Publication Data

US 2023/0317900 A1 Oct. 5, 2023

(30) Foreign Application Priority Data

Sep. 8, 2020 (DE) ......................... 102020123386.8

(51) Int. Cl.
*H10H 20/857* (2025.01)
*H10H 20/01* (2025.01)

(52) U.S. Cl.
CPC ........ *H10H 20/857* (2025.01); *H10H 20/013* (2025.01); *H10H 20/0364* (2025.01)

(58) Field of Classification Search
CPC ............. H10H 20/816; H10H 20/8162; H10H 29/8321; H10H 20/831; H10H 20/8314;
(Continued)

(56) References Cited

U.S. PATENT DOCUMENTS 6,507,057 B1 1/2003 Ohno
2010/0227421 A1 9/2010 Neff et al.
(Continued)

FOREIGN PATENT DOCUMENTS

CN 101150156 A 3/2008
DE 102015112538 A1 2/2017
(Continued)

OTHER PUBLICATIONS

Korean office action issued for the corresponding Korean patent application No. 10-2023-7006071, dated Jun. 2, 2025, 6 pages (for informational purposes only).
(Continued)

*Primary Examiner* — Latanya N Crawford Eason
(74) *Attorney, Agent, or Firm* — VIERING, JENTSCHURA & PARTNER mbB

(57) ABSTRACT

A component may include a semiconductor body, an insulation structure, and a connection structure. The semiconductor body may have a first semiconductor layer, a second semiconductor layer, and an active zone located therebetween. The connection structure may have a connection layer in direct electrical contact with the second semiconductor layer. The insulation structure may adjoin both the second semiconductor layer and the connection layer. The insulation structure may laterally surround and may partially cover the connection layer in top view. The connection structure may have through-contacts in electrical contact with the connection layer and along a vertical direction, which extend throughout the insulation structure. The component may have a back side formed as a mounting surface, which is structured and formed, at least in regions, by surfaces of the connection structure. The through-contacts may be formed as individual, one-piece contact columns or as integral parts of a continuous contact layer.

19 Claims, 9 Drawing Sheets

(58) Field of Classification Search

CPC ............. H10H 20/8316; H10H 20/857; H10H 20/0364; H10H 20/013; H10H 20/103; H10H 29/49; H10H 29/857; H10H 29/922; H10H 29/942; H10H 29/0364; H10H 20/01; H01L 21/768; H01L 23/481

See application file for complete search history.

(56) References Cited

U.S. PATENT DOCUMENTS

| | | | |
|---|---|---|---|
| 2012/0040480 | A1 | 2/2012 | Shieh et al. |
| 2012/0273823 | A1 | 11/2012 | Yoneda et al. |
| 2013/0134455 | A1 | 5/2013 | Tanaka et al. |
| 2013/0313588 | A1 | 11/2013 | Kojima et al. |
| 2015/0108528 | A1 | 4/2015 | Chae et al. |
| 2016/0240759 | A1 | 8/2016 | Chae |
| 2017/0148966 | A1 | 5/2017 | Schwarz et al. |
| 2018/0198045 | A1 | 7/2018 | Perzlmaier et al. |
| 2018/0248083 | A1 | 8/2018 | Hoeppel et al. |
| 2018/0261730 | A1 | 9/2018 | Hoeppel et al. |
| 2019/0148596 | A1 | 5/2019 | Park et al. |
| 2019/0245114 | A1* | 8/2019 | Pfeuffer .................. H01L 24/17 |
| 2020/0091681 | A1 | 3/2020 | Gerhard et al. |
| 2020/0350467 | A1* | 11/2020 | Lin .................... H10H 20/8316 |
| 2021/0391506 | A1* | 12/2021 | Leber ................... H10H 20/831 |

FOREIGN PATENT DOCUMENTS

| | | | |
|---|---|---|---|
| DE | 102015115722 | A1 | 3/2017 |
| DE | 112015003963 | T5 | 6/2017 |
| DE | 102016113193 | A1 | 1/2018 |
| JP | S54-168173 | U | 11/1979 |
| JP | 2012519954 | A | 8/2012 |
| JP | 2012238823 | A | 12/2012 |
| JP | 2013115254 | A | 6/2013 |
| JP | 2013247288 | A | 12/2013 |
| JP | 2014053593 | A | 3/2014 |
| JP | 2017055020 | A | 3/2017 |
| JP | 2019192731 | A | 10/2019 |
| KR | 20010101038 | A | 11/2001 |
| WO | 2018122103 | A1 | 7/2018 |

OTHER PUBLICATIONS

Japanese office action issued for the corresponding Japanese patent application No. 2023-515404, dated Jul. 10, 2024, 3 pages (for informational purposes only).

International Search Report issued for corresponding PCT application No. PCT/EP2021/072058, mailed Nov. 23, 2021, 5 pages (For informational purposes only).

Search Report for corresponding German Patent Application No. 10 2020 123 386.8, issued on Oct. 23, 2020, 5 pages (For informational purposes only).

Japanese Search Report for corresponding Japanese patent application No. 2023-515404, dated Feb. 9, 2024, 50 pages (for informational purposes only).

Chinese Office Action received for corresponding application CN 202180050836.0, dated Jul. 26, 2026, 10 pages (for reference purpose only).

* cited by examiner

COMPONENT WITH IMPROVED CONNECTION STRUCTURE AND METHOD FOR PRODUCING A COMPONENT

CROSS-REFERENCE TO RELATED APPLICATIONS

The present application is a national stage entry according to 35 U.S.C. § 371 of PCT application No.: PCT/EP2021/072058 filed on Aug. 6, 2021; which claims priority to German patent application DE 10 2020 123 386.8, filed on Sep. 8, 2020; all of which are incorporated herein by reference in their entirety and for all purposes.

TECHNICAL FIELD

A component with an improved connection structure is provided. Furthermore, a method for producing a component, in particular such a component, is provided.

BACKGROUND

When connecting and fastening micro-components to a target substrate, it is not uncommon for bonding material not to be optimally distributed under the micro-components or, in places, not to be optimally pressed out to the side, as a result of which, in unfavorable cases, the micro-components cannot be fastened precisely, over a large area and reliably to the target substrate.

One objective is to specify a component, in particular an optoelectronic component, which can be mounted on a target substrate quickly, precisely, reliably and in a simplified manner. Another objective is to provide a reliable and cost-efficient method for producing a component, in particular a component with a structured mounting surface.

SUMMARY

According to at least one embodiment of a component, the latter has a semiconductor body and a connection structure, wherein a back side of the component is formed as a structured mounting surface which is formed at least in regions by surfaces of the connection structure.

In particular, the component is a light emitting component, for example a μLED. For example, a lateral width and/or a lateral length of the component are/is less than 1000 μm, 500 μm, 300 μm, 200 μm, 100 μm, 50 μm, 30 μm, 20 μm, or less than 10 μm. For example, the lateral width or the lateral length of the component is between 10 μm and 1000 μm, 10 μm and 500 μm, 10 μm and 300 μm, or between 10 μm and 100 μm, inclusive. The component has an overall vertical height which is, for example, between inclusively 1 μm and 500 μm, 1 μm and 300 μm, 1 μm and 200 μm, 1 μm and 100 μm, or between inclusively 1 μm and 50 μm. If the μLED is thin, the overall vertical height may be between inclusively 1 μm and 10 μm, or between inclusively 1 μm and 5 μm, for instance about 2-3 μm. The component described herein is not limited to the above geometric specifications and may have other, for instance greater or smaller width, length, or overall height.

A lateral direction is understood to mean a direction that runs parallel to a main extension surface of the component, in particular parallel to a main extension surface of the semiconductor body of the component. For example, the lateral direction is parallel to a front side of the component. A vertical direction is understood to mean a direction directed in particular perpendicular to the main extension surface of the component, of the semiconductor body or of the front side of the component. The vertical direction and the lateral direction are in particular orthogonal to each other.

According to at least one embodiment of the component, it has an insulation structure that is adjacent to both the semiconductor body and the connection structure. The connection structure has through-contacts which extend along a vertical direction, for example throughout the insulation structure. In particular, the structured back side of the component, which is formed as a mounting surface, is formed in regions by surfaces of the through-contacts. The number of the through-contacts of the component may be at least 3, 5, 10, 20, 50 or 100. For example, the number of the through-contacts of the component is between inclusively 3 and 500, 3 and 400, 3 and 300, 3 and 200, 3 and 100, 3 and 50, or between inclusively 3 and 20. In particular, the punctually arranged through-contacts each have a diameter which is, for example, smaller than 5 μm, 3 μm, or smaller than 1 μm. For example, the diameter is between inclusively 100 nm and 5 μm, inclusively 200 nm and 5 μm, or between inclusively 500 nm and 5 μm. However, the diameter of the through-contacts is not limited to the above. In particular, the through-contacts may each be strip-shaped and may have greater or smaller length or width.

Through-contacts are in particular parts or regions of the connection structure which, in top view, have overlaps with the connection layer and extend along the vertical direction throughout the insulation structure for electrically contacting the connection layer. Such through-contacts may be implemented as individual separate parts or as integral parts of the connection structure, for instance integral parts of a continuous contact layer of the connection structure. In top view, the parts or regions of the connection structure formed or defined as through-contacts are in particular each located within one of the contact openings of the insulation structure and thus do not have any overlaps with the insulation structure.

In at least one embodiment of a component, it comprises a semiconductor body, an insulation structure and a connection structure. The semiconductor body comprises a first semiconductor layer, a second semiconductor layer and an active zone located therebetween. The connection structure comprises a connection layer, which is in particular in direct electrical contact with the second semiconductor layer. The insulation structure adjoins both the second semiconductor layer and the connection layer, wherein the insulation structure laterally surrounds the connection layer and partially covers it in top view. The connection structure has through-contacts that are in electrical contact with the connection layer and extend throughout the insulation structure along a vertical direction. The component has a back side formed as a mounting surface which is structured and is formed at least in regions by surfaces of the connection structure, in particular by surfaces of the through-contacts.

Instead of a smooth back side, the component thus has a structured back side as a mounting surface. The structured mounting surface thus makes it easier to attach the component to a target mounting surface, for instance a target substrate. The structuring may be in the form of roughening and/or in the form of local depressions and elevations. In top view of the back side of the component, the connection structure can have a plurality of point-like through-contacts or be formed as a bar-shaped connection structure and/or as a roughened connection structure. The structured back side can improve the contacting, in particular throughout the inter-via material, of the target mounting surface. Part or all of the back side of the component can be formed as a connection pad of the component, which is formed in particular with a large surface area, which minimizes the risk of tilting of the component when it is placed on the target mounting surface. Due to the presence of several through-contacts, in particular formed in a point-like manner, it is possible that the structured back side is not interrupted over a large area, as a result of which the electrical connection between the component and the target mounting surface is optimized.

According to at least one embodiment of the component, the connection structure has through-contacts, wherein the through-contacts are formed as individual, integrally formed contact columns. In particular, the through-contacts are arranged in the openings of the insulation structure on the connection layer, wherein the through-contacts protrude beyond the insulation structure along the vertical direction. For example, the through-contacts are exposed at the back side of the component. A through-contact is formed in one-piece manner if the through-contact is formed as a single piece. In particular, the through-contact does not have individual separate layers arranged, for example, one above the other or next to each other. In particular, the through-contact is formed from a single layer. For example, the through-contact does not have an internal interface between two sublayers of the same material or of different materials.

In particular, the through-contact is not formed from two or more different layers.

Alternatively or in addition, it is possible for the connection structure to have a continuous contact layer, wherein the through-contacts is formed as integral parts of the continuous contact layer. The back side may have local depressions whose bottom surfaces are at least partially formed by surfaces of the through-contacts. If the through-contacts are formed as integral parts of the continuous contact layer, the through-contacts and the contact layer may be formed together in one-piece manner. The through-contacts and the contact layer are formed in one-piece manner if they are formed, for example, from one single piece and, in particular, if there are no internal interfaces between the contact layer and the through-contacts. The through-contacts and the contact layer are in particular formed from a single layer. The through-contacts and the contact layer may have the same material composition or may be formed from the same material. Locally, the through-contacts may each be formed in a one-piece manner.

According to at least one embodiment of the component, the through-contacts project beyond the insulation structure. At the back side of the component, the through-contacts can be freely accessible at least in places. The through-contacts may be parts of a contact layer of the connection structure. For example, the connection structure is configured exclusively for making electrical contact with the second semiconductor layer. The second semiconductor layer may be p-type, but can also be n-type. The back side of the component can be free of a further connection structure which is configured for electrically contacting the first semiconductor layer. Depending on the second semiconductor layer, the first semiconductor layer can be n-type or p-type. For example, the component has at least one contact point on its front side, which is provided for making electrical contact with the first semiconductor layer.

According to at least one embodiment of the component, the back side has local depressions or local elevations whose surfaces are at least partially formed by surfaces of the through-contacts. If the through-contacts are spatially spaced apart from one another in lateral directions and are electrically conductively connected to one another, for example, exclusively via the connection layer, the through-contacts form local elevations on the back side of the component. The through-contacts may have exposed surfaces that form portions of the surface of the back side of the component. Each of the through-contacts may be disposed within one of the openings, for instance within one of the contact openings of the insulation structure. The through-contact disposed within the opening of the insulation structure may be spaced apart from the insulation structure in lateral directions. In particular, an intermediate region is located between the through-contact and the side walls of the opening of the insulation structure, wherein the intermediate region may be filled with a gaseous medium, for instance air, or with a further electrically insulating material.

According to at least one embodiment of the component, the through-contacts are spatially spaced from each other along the lateral direction. In particular, the through-contacts are formed as individual contact columns of the component. For example, the individual contact columns are electrically conductively connected to each other exclusively via the connection layer. If the contact columns are electrically conductively connected to each other exclusively via the connection layer, they would be electrically separated from each other without the presence of the connection layer.

According to at least one embodiment of the component, the insulation structure has openings on the connection layer in which the through-contacts are arranged. The through-contacts protrude along the vertical direction, in particular beyond the insulation structure. In lateral directions, for instance in all lateral directions, the through-contacts are spaced from the insulation structure, in particular by an intermediate region or intermediate regions. One of the through-contacts or each of the through-contacts may be fully laterally surrounded by an intermediate region associated therewith. At the back side of the component, the through-contacts may be freely accessible.

In top view, the through-contacts in particular only partially cover the connection layer. For example, in top view, the through-contacts cover at most 3%, 5%, 10%, 20%, 30%, 40%, 50%, 60% or at most 70% of a surface of the connection layer. It is possible that the connection structure, which is configured to electrically contact the second semiconductor layer, is formed exclusively by the connection layer and the through-contacts. It is possible for the connection layer to have a plurality of sublayers. However, the connection structure may be void of a further contact layer for lateral current expansion, wherein the further contact layer differs from the connection layer and is in electrical contact with the through-contacts. Furthermore, the connection structure may be void of a further connection pad, wherein the through-contact or the plurality of through-contacts is/are arranged in vertical direction between the further connection pad and the connection layer.

According to at least one embodiment of the component, the back side has local depressions, whose bottom surfaces are at least partially formed by surfaces of the through-contacts. However, it is not mandatory that all depressions have such bottom surfaces which are at least partially formed by surfaces of the through-contacts.

It is possible, for example, that the back side has local depressions, whose bottom surfaces are formed by surfaces of the insulation structure. Furthermore, it is possible that the back side has local depressions, whose bottom surfaces are formed by surfaces of further parts of the connection structure that do not extend throughout the insulation structure. Such local parts of the connection structure are located, for example, on the insulation structure or merely penetrate into and do not extend throughout the connection structure. For local depressions, in particular for all local depressions which, in top view, have for instance no overlaps with the insulation structure, it is possible for their bottom surfaces to be formed at least partially or completely by surfaces of the through-contacts.

According to at least one embodiment of the component, the connection structure has a continuous contact layer. In particular, the through-contacts are formed as integral parts of the continuous contact layer. For example, the contact layer and the through-contacts form an integrally formed unit. The contact layer and the through-contacts may be formed from the same material. It is possible for the contact layer and the through-contacts to be produced in a common process step.

In top view, the continuous contact layer comprising the through-contacts may completely cover the underlying connection layer. It is possible that at least 50%, 60%, 70%, 80%, 90% or at least 95%, for example between inclusively 50% and 98%, 50% and 95%, 60% and 95%, 70% and 95% or between inclusively 80% and 95% of the total area of the back side is formed by surfaces of the continuous contact layer. The back side or the mounting surface of the component may be formed exclusively by surfaces of the connection structure and of the insulation structure, for instance exclusively by surfaces of the contact layer, the through-contacts and of the insulation structure.

According to at least one embodiment of the component, the back side is formed to be freely accessible and structured. The back side has local depressions as well as local elevations. In particular, the local elevations are parts of the connection structure and are different from the through-contacts. In top view, the elevations can be arranged on the insulation structure. The local elevations, which are different from the through-contacts, are in particular located outside the openings of the insulation structure. Both the local elevations and the local depressions may be implemented as parts, for instance as integral parts of the continuous contact layer of the connection structure. For example, the local elevations and the through-contacts have the same material composition.

According to at least one embodiment of the component, at least 50%, 60%, 70%, 80% or at least 90% of the total area of the back side is formed by a roughened or bar-shaped surface of the connection structure. If the back side is formed in a structured manner, the back side, in particular the electrically conductive surface of the back side, can be roughened and/or have bar-shaped structures. The back side is thus not smooth or planar. For example, the structured back side has local depressions or local elevations with vertical depths or heights of at least 1 μm, 3 μm, 5 μm, 7 μm, 10 μm, 20 μm or at least 30 μm, for instance between inclusively 1 μm and 100 μm, between inclusively 1 μm and 50 μm, between inclusively 1 μm and 10 μm, between inclusively 1 μm and 5 μm or between inclusively 1 μm and 3 μm. If the back side has bar-shaped structures, parallel bars may extend, for example, with a bar width of 1-5 μm or 1-2 μm across the entire back side to edges, for instance to the mesa edges of the component. If the back side is roughened, it can have rough nanostructures at least in places. In this case, the local depressions or local elevations can be smaller than 1 μm, at least in places.

According to at least one embodiment of the component, the back side is formed to be freely accessible and structured. In particular, the back side has local depressions as well as local elevations, wherein the local elevations are parts of the connection structure and differ from the through-contacts. In particular, the local elevations are bar-shaped, such that those local depressions located between two adjacent local elevations each form a channel-shaped structure on the back side. In top view, the back side of the component can thus have bar-shaped elevations and channel-shaped depressions arranged alternately next to one another.

A bonding material, which is used for instance to attach the component to the target mounting surface, can be easily and reliably pressed outwards under the component, particularly along the channel-shaped structures. As a result, the back side of the component can be optimized for mounting purposes. The connection structure can form a large area connection pad on the back side of the component, resulting in minimizing the risk of tilting when the component is placed on the target mounting surface. The structured surface can also provide improved anchorage of the component when the component is placed on the target mounting surface. Furthermore, the high electrical conductivity and the high thermal conductivity between the component and a target substrate can be ensured by the many, in particular, narrow and closely adjacent bar-shaped elevations.

According to at least one embodiment of the component, the connection layer is made opaque to radiation, in particular reflective to radiation. The connection layer may comprise a single layer or a layer sequence of several sublayers, for example a layer sequence of Pt, Ag, Ni and/or WTi sublayers. In top view of the semiconductor body, the connection layer may cover a major portion of a surface of the semiconductor body, for example covering at least 40%, 50%, 60%, 70%, 80%, or at least 90% of the surface of the semiconductor body. If the connection layer does not completely cover the surface of the semiconductor body, it may be that the connection layer is arranged centrally on the semiconductor body in top view. If the connection layer is arranged in the center or centrally on the semiconductor body, current injection into the semiconductor body can be optimally achieved.

According to at least one embodiment of the component, it comprises a radiation-transmissive substrate. The substrate may be a growth substrate, for instance a sapphire substrate. It is also possible for the substrate to be different from a growth substrate. A front side of the component may be formed by surface of the radiation transmissive substrate. In particular, the front side is formed as a radiation-transmissive surface of the component. In this regard, it is possible for the component to have a plurality of radiation-transmissive surfaces. For example, the component may be formed as a volume emitter and have side surfaces that are also formed as radiation-transmissive surfaces.

According to at least one embodiment of the component, the insulation structure is of multi-layered fashion. The insulation structure can have at least two different directly adjacent sublayers with different material compositions, for example of different oxide materials. At least one of the sublayers may be structured and have, for example, a roughened structure or a bar structure.

In particular, the roughened structure or the bar structure is reproduced on the back side of the component. For example, the insulation structure has at least one SiO2 layer or two SiO2 layers and at least one Al2O3 layer. However, the insulation structure is not necessarily limited to such materials. It is possible that the insulation structure is formed as a layer sequence from several sublayers, as a result of which the adjacent sublayers can be formed from different materials, so that the insulation structure acts as a dielectric mirror, at least in the regions sideways of the connection layer.

A method for producing a component, in particular a component described herein, is provided.

In at least one embodiment of a method for producing a component, a semiconductor body is provided. The semiconductor body has, in particular, a first semiconductor layer, a second semiconductor layer and an active zone located therebetween. A connection layer is formed, which is in particular in direct electrical contact with the second semiconductor layer. An insulation structure is formed which is adjacent, in particular directly adjacent, to both the second semiconductor layer and the connection layer. The insulation structure can laterally enclose and initially completely cover the connection layer in top view. The insulation structure is patterned to expose areas of the connection layer, so that the insulation structure only partially covers the connection layer in top view. The through-contacts are applied to the exposed areas of the connection layer, wherein the through-contacts are in electrical contact with the connection layer and extend throughout the insulation structure along a vertical direction, so that the component has a back side formed as a mounting surface which is structured and is formed at least in places by surfaces of the through-contacts.

In particular, the through-contacts are formed as individual, one-piece contact columns, are arranged in openings of the insulation structure on the connection layer and project beyond the insulation structure along the vertical direction. For example, the through-contacts are exposed at the back side of the component. Alternatively or in addition, the connection structure has a continuous contact layer, wherein the through-contacts are formed as integral parts of the continuous contact layer. In particular, the back side has local depressions, whose bottom surfaces are at least partially formed by surfaces of the through-contacts.

According to at least one embodiment of the method for producing a component, a temporary and removable layer is applied onto the insulation structure. Openings are formed in the temporary and removable layer to form a mask layer.

The temporary and removable layer can be a photo-structurable lacquer layer. A negative lacquer or a positive lacquer can be used as the material for the lacquer layer. The negative lacquer can be polymerized by exposure. For instance after a subsequent heating step, in particular after a development step, the exposed areas may remain. In the case of positive lacquers, the already solidified lacquer is made soluble again, for example by exposure, and after the step of development, only those areas remain which have been protected from irradiation, for example by a mask.

According to at least one embodiment of the method for producing a component, the temporary and removable layer is a lacquer layer formed from a photo-structurable negative lacquer or from a photo-structurable positive lacquer, wherein the lacquer layer is photo-structured to form the mask layer.

According to at least one embodiment of the method for producing a component, contact openings are formed in the openings of the mask layer, which extend throughout the insulation structure to the connection layer. In a subsequent process step, the through-contacts are formed in the contact openings before the mask layer is removed. After the through-contacts have been formed, the mask layer, which is formed in particular from the lacquer layer, is removed, in particular completely removed from the component.

According to at least one embodiment of the method for producing a component, the contact openings are formed by an etching process, wherein the connection layer serves as an etch stop layer.

According to at least one embodiment of the method for producing a component, the insulation structure has a first sublayer and a second sublayer, wherein the openings are formed in the second sublayer for transferring a roughened structure or a bar structure into the second sublayer. In particular, the roughened structure or the bar structure is subsequently reproduced on the back side of the component. In particular, the roughened structure has a rough nanostructure or areas with rough nanostructures, at least in places. On the insulation structure, which is formed from one dielectric material or from a plurality of dielectric materials and is configured at least for lateral encapsulating the connection layer, wherein the roughened structure or the bar structure can be produced in particular by photolithography and dry etching, for example by RIE (Reactive Ion Etching).

According to at least one embodiment of the method for producing a component, the first sublayer and the second sublayer of the insulation structure have different material compositions, wherein the first sublayer are formed to be more etch-resistant than the second sublayer. The openings in the second sublayer can be formed by an etching process, wherein the first sublayer serves in particular as an etch stop layer.

According to at least one embodiment of the method for producing a component, a temporary mask layer is used to form the openings in the second sublayer and is subsequently removed. A third sublayer of the insulation structure is applied to the second patterned sublayer and/or to the first sublayer, as a result of which the roughened structure or the bar structure is reproduced on a surface of the third sublayer facing away from the semiconductor body. A further mask layer having openings is formed on the third sublayer, wherein the contact openings are formed in the openings of the further mask layer and extend through-out the first sublayer of the insulation structure to the connection layer. In a subsequent method step, a continuous contact layer of the connection structure is formed, wherein through-contacts are formed in the contact openings as integral parts of the continuous contact layer, and wherein the roughened structure or the bar structure are reproduced on a surface of the continuous contact layer facing away from the semiconductor body.

In particular, the roughened structure or the bar structure of the connection structure is formed exclusively by applying the material or materials of the connection structure onto the structured insulation structure. It is thus possible for the roughened structure or the bar structure to be applied onto the insulation structure in a structured manner without post-processing.

The method described above is particularly suitable for the production of a component described herein. The features described in connection with the component can therefore also be used for the method, and vice versa.

BRIEF DESCRIPTION OF THE DRAWINGS

Further non-limiting embodiments and further embodiments of the component as well as of the method for producing a component will become apparent from the embodiments explained below in connection with FIGS. 1A to 6D.

FIGS. 4A, 4B, 4C and 4D show schematic illustrations of some method steps for producing a component, in particular according to the first embodiment.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification. In FIG. 1A, a component 10 according to a first embodiment is schematically shown. The component 10 has a semiconductor body 2 which has a first semiconductor layer 21, a second semiconductor layer and an active zone 23 arranged between the semiconductor layers 21 and 22. For example, the first semiconductor layer 21 is n-type and the second semiconductor layer 22 is p-type, or vice versa. In particular, the semiconductor body 2 has a buffer layer 20 disposed between the first semiconductor layer 21 and a substrate 9. For example, the substrate 9 is a growth substrate. The component 10 has a front side 11, in particular formed by an exposed surface of the substrate 9. The front side 11 in particular a radiation-transmissive surface of the component 10.

DETAILED DESCRIPTION

Figure 1A:
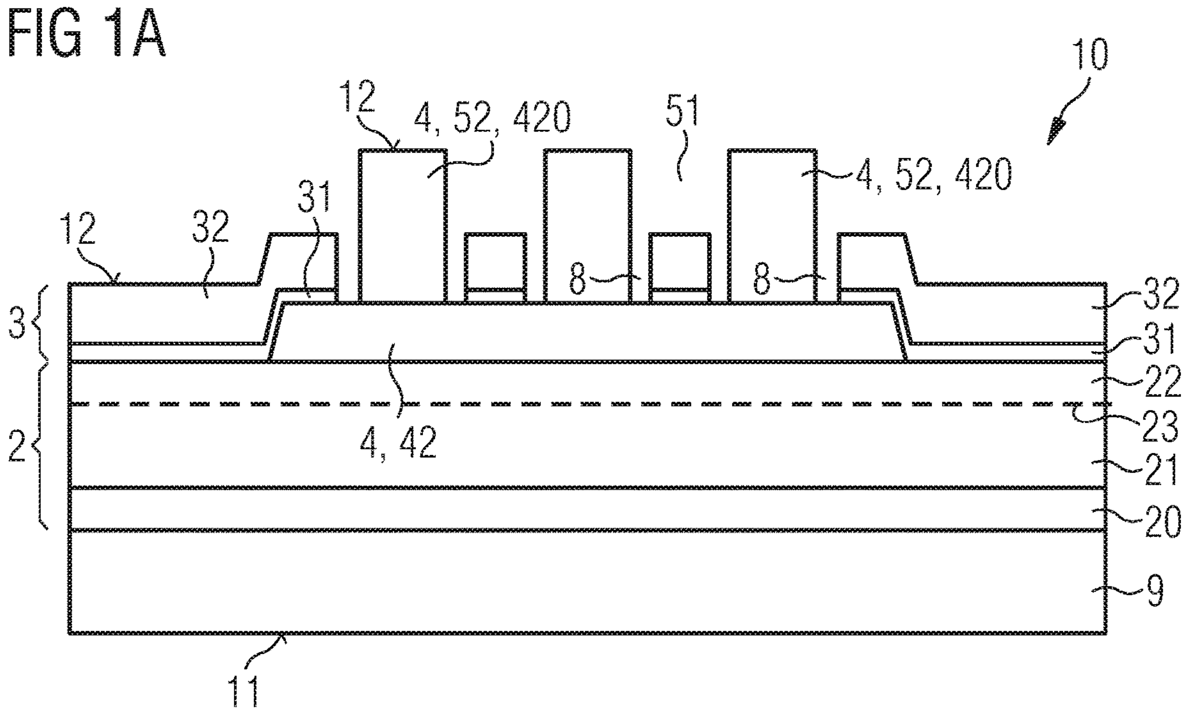
FIGS. 1A and 1B show schematic representations of a first exemplary embodiment of a component in sectional view and in top view.

In operation of the component 10, the active zone 23 is configured to generate or detect electromagnetic radiation, for example, in the ultraviolet, infrared, or visible spectral regions. For example, the active zone 23 is a pn-junction zone. The semiconductor body may be based on a III-V or on a II-VI semiconductor compound material. In particular, the semiconductor body 2 is based on a III-V compound semiconductor material if it comprises at least one element from the main group III, for instance Al, Ga, In, and one element from the main group V, for instance N, P, As. For example, the semiconductor body 2 is based on GaN. In particular, the term "III-V semiconductor compound material" includes the group of binary, tertiary and quaternary compounds containing at least one element from main group III and at least one element from main group V, for example nitride and phosphide compound semiconductors. Analogously, it applies to a semiconductor body 2 based on the group II-VI compound semiconductor material.

The component 10 has an insulation structure 3. According to FIG. 1A, the insulation structure 3 comprises at least a first sublayer 31 and a second sublayer 32. The first sublayer 31 is, for example, a metal oxide layer, for instance an Al2O3 layer. The second sublayer 32 is, for example, a TEOS layer, for instance a SiO2 layer. TEOS is an abbreviation for tetraethyl orthosilicate and is a liquid used in particular in semiconductor technology for producing oxide layers. A TEOS layer is an electrically insulating layer, wherein TEOS is used for producing the TEOS layer. Deviating from FIG. 1A, the insulation structure 3 may have more than two sublayers 31 and 32, for instance at least or exactly 3, 4 or five sublayers.

According to FIG. 1A, the insulation structure 3, in particular the first sublayer 31, adjoins the second semiconductor layer 22 in places. It is possible that the first sublayer 31 is directly adjacent to the second semiconductor layer 22 in places.

The component 10 has a contact structure 4. In particular, the contact structure 4 is configured for electrically contacting the second semiconductor layer 22. The component 4 may have a further contact structure which is arranged to make electrical contact with the first semiconductor layer 21. However, the further contact structure is not shown in FIG. 1A.

The contact structure 4 has a connection layer 42 that is in electrical contact with the second semiconductor layer 22. In particular, the connection layer 42 is directly adjacent to the second semiconductor layer 22. The connection layer 42 may be formed from one or several of the following materials, namely: Pt, Ag, Ni, WTi and ZnO. It is possible that the connection layer 42 is a layer sequence of a plurality of sublayers of different materials. In lateral directions, the connection layer 42 is enclosed, in particular fully enclosed, by the insulation structure 3. In top view, the insulation structure 3 covers the connection layer 42 in places. On the connection layer 42, the insulation structure 3 has openings whose bottom surfaces may be formed by surfaces of the connection layer 42. It is also possible that the connection layer 42 to the second semiconductor layer 22 is formed from a transparent electrically conductive oxide, for instance ITO.

The contact structure 4 has a plurality of through-contacts 420 which are in electrical contact with the connection layer 42. The through-contacts 420 are arranged in particular in the openings of the insulation structure 3. Along the vertical direction, the through-contacts 420 extend in particular throughout the insulation structure 3 and project beyond the insulation structure 3. According to FIG. 1A, the through-contacts 420 are spatially spaced from each other in the lateral direction. The through-contacts 420 are thus formed as individual contact columns which, in top view, are arranged on the connection layer 22, are in electrical contact therewith and are formed as local elevations 52 on a back side 12 of the component 10.

In top view, each of the through-contacts 420 may be arranged in one of the openings of the insulation structure 3, with the through-contact 420 being spatially spaced from the insulation structure 3 in lateral directions. Thus, according to FIG. 1A, an intermediate region 8 is located between the insulation structure 3 and the through-contact 420. The intermediate region 8 may be filled with a gaseous medium, for instance air. It is also possible that the intermediate region 8 is filled with an electrically conductive material, which is in particular different from a material of the insulation structure 3. In top view, the through-contact 420 thus has a smaller diameter than a diameter of the opening of the insulation structure 3 associated therewith. Deviating therefrom, however, it is possible that the through-contact 420 is directly adjacent to the insulation structure 3. In this case, the through-contact 420 and its associated opening of the insulation structure 3 may have the same diameter.

According to FIG. 1A, the back side 12 of the component 10 is formed in regions by surfaces of the insulation structure 3 and the through-contacts 420. The back side 12 of the component 10 is shown schematically in FIG. 1B. The back side 12 has a plurality of local elevations 52 formed in particular by the through-contacts 420, wherein the through-contacts 420 each are arranged in one of the openings of the insulation structure 3 and project along the vertical direction beyond the insulation structure 3. In this sense, the back side 12 is formed in a structured manner, wherein the structuring of the back side 12 is defined mainly by the distribution of the through-contacts 420. In order to achieve as homogeneous as possible current injection into the semiconductor body 2, the through-contacts 420 may be evenly distributed on the connection layer 42 or on the back side 12.

Laterally to the connection layer 42, the insulation structure 3 has frame-shaped regions which, in top view, do not overlap with the connection layer 42. These frame-shaped regions of the insulation structure 3 can thus form a holding structure 7, in particular a frame-shaped holding structure 7, or several holding structures 7 of the component 10.

Figure 2A:
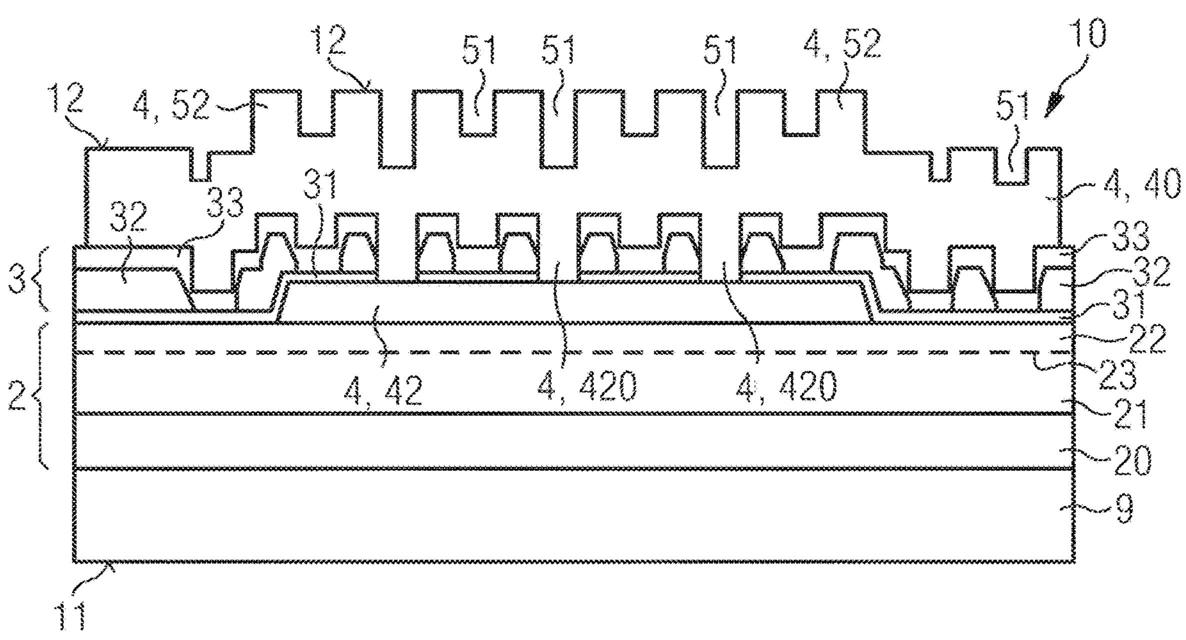
FIGS. 2A and 2B show schematic representations of a second exemplary embodiment of a component in sectional view and in top view.

The exemplary embodiment shown in FIG. 2A essentially corresponds to the exemplary embodiment of a component 10 shown in FIG. 1A. In contrast thereto, the insulation structure 3 has a roughened structure, wherein the roughened structure of the insulation structure 3 is reproduced on the back side 12 of the component 10 by a roughened surface of the contact structure 4. In addition, the contact structure 4 is formed to be continuous. The contact structure 4 has a contact layer 40 which mechanically and electrically connects the through-contacts 420, in particular all through-contacts 420, to one another. The contact layer 40 and the through-contacts 420 may be formed of the same materials. In particular, the contact layer 40 and the through-contacts 420 can be formed on the insulation structure 3 or on the semiconductor body 2 during a common process step.

According to FIG. 2A, the insulation structure 3 has a further sublayer 33 in addition to the first and second sublayers 31 and 32. The second sublayer 32 and the further third sublayer 33 can be formed from the same material or from different materials. The further sublayer 33 is arranged in a vertical direction between the second sublayer 32 and the contact layer 40. In particular, the further third sublayer 33 and the contact layer 40 have the same or a similar pattern of structuring. For example, the patterning pattern of the contact layer 40 is predetermined by the patterning pattern of the further sublayer 33.

The back side 12 has a plurality of local depressions 51 and local elevations 52. Some of the local depressions 51 have bottom surfaces formed by surfaces of the through-contacts 420. Other local depressions 51 have bottom surfaces formed by surfaces of the contact layer 40. These further local depressions 51 have smaller vertical depths than the local depressions 51 whose bottom surfaces are formed by surfaces of the through-contacts 420.

In top view, the through-contacts 420 are located in the respective openings of the insulation structure 3. In particular, the through-contacts 420 are directly adjacent to the insulation structure 3. The through-contacts 420 and the respective openings of the insulation structure 3 can thus have the same diameter in pairs. Inside the openings, the through-contacts 420 are in particular directly adjacent to the sublayers 31, 32 and 33. Outside the openings, the contact layer 40 is directly adjacent to the insulation structure 3, but exclusively adjacent to the further sublayer 33 of the insulation structure 3. Along the vertical direction, the through-contacts 420 extend through the sublayers 31, 32 and 33 of the insulation structure 3 and project beyond the insulation structure 3.

Figure 2B:
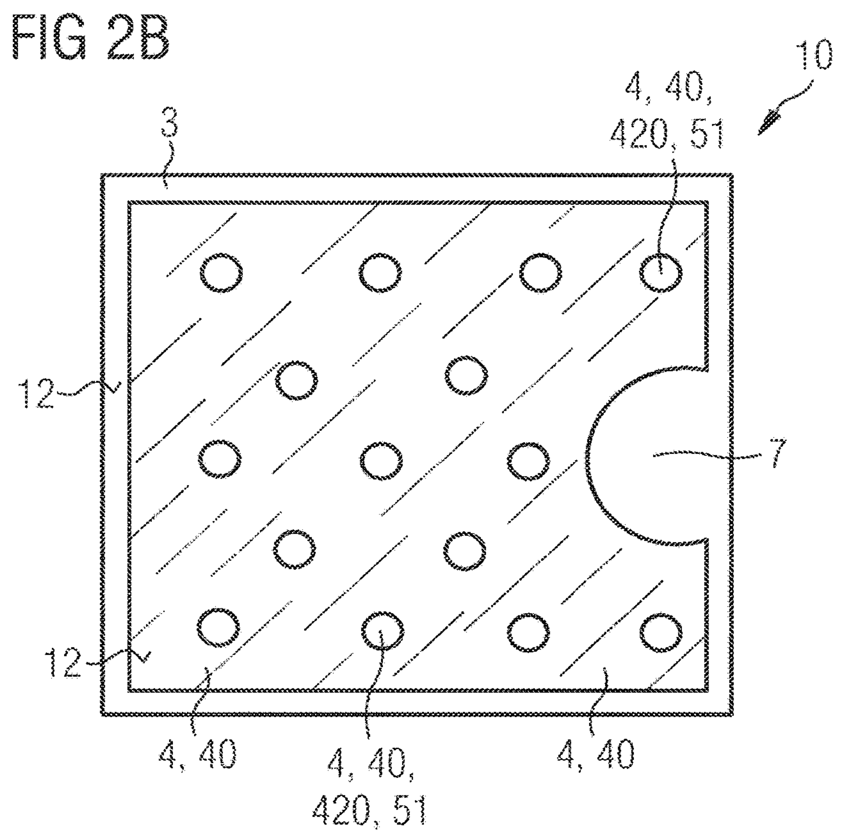

In FIG. 2B, the component 10 is shown schematically in a top view on the back side 12. The back side 12 has a structured design, wherein the structuring of the back side 12 is essentially defined by the arrangement of the through-contacts 420 and the structuring of the contact layer 40. The back side 12 has exposed, in particular frame-shaped, regions of the insulation structure 3 which, in top view, are not covered by the contact structure 4. At one edge of the component 10, the back side 12 has a holding structure 7, which is formed by a widened exposed region of the insulation structure 3.

Figure 3A:
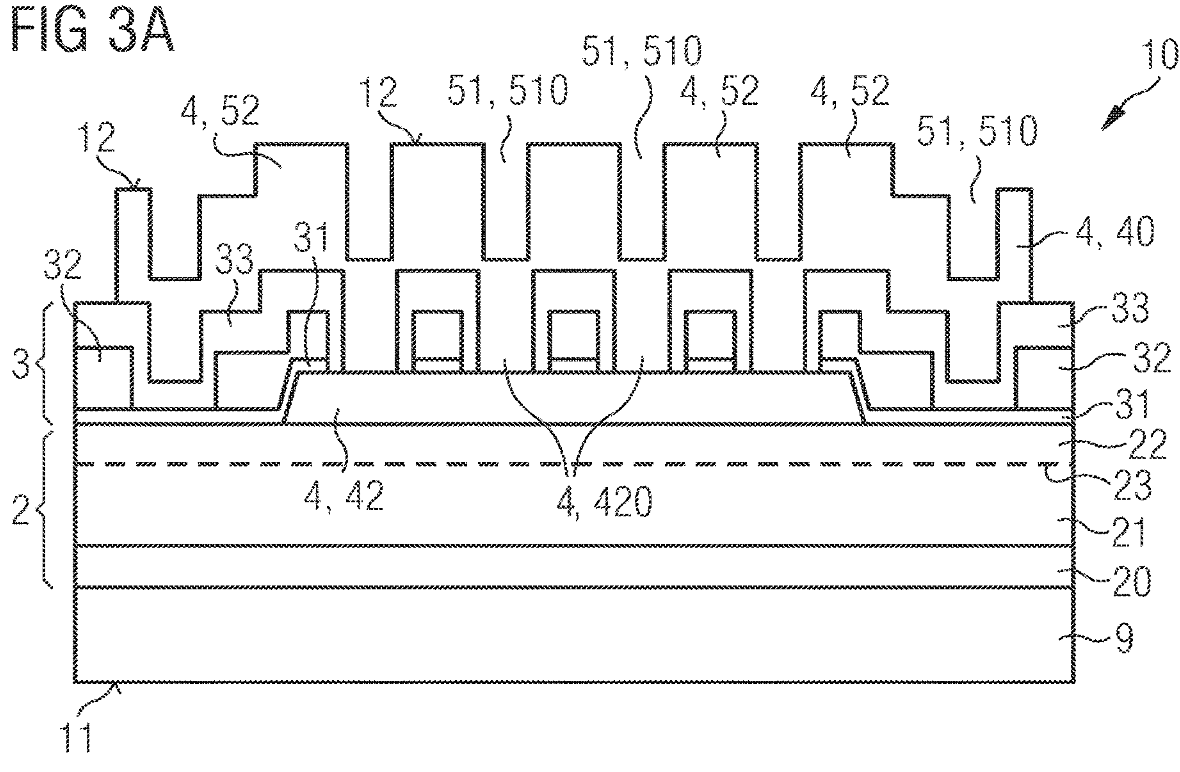
FIGS. 3A and 3B show schematic representations of a third exemplary embodiment of a component in sectional view and in top view.

The exemplary embodiment shown in FIG. 3A essentially corresponds to the exemplary embodiment of a component 10 shown in FIG. 2A. In contrast thereto, the back side 12 of the component 10 does not have a roughened structure but a bar structure, which is shown schematically for instance in FIG. 3B. Also, the second sublayer 32 and/or the further sublayer 33 of the insulation structure 3 may not have a bar structure which has for instance the same or a similar pattern of structuring compared to the bar structure on the back side 12. In other words, the bar structure on the back side 12 of the component 10 is reproduced on the bar structure of the sublayer 32 or 33.

Both the through-contacts 420 and the respective openings of the insulation structure 3 may be strip-shaped. In particular, the strip-shaped through-contacts 420 are located below the strip-shaped channel-shaped depressions 510 shown for instance in FIGS. 3A and 3B. In particular, the through-contacts 420 are directly adjacent to the insulation structure 3. Thus, the through-contacts 420 and the respective openings of the insulation structure 3 may have pairwise equal width and/or length. In top view on the back side 12, the component 10 has local depressions 51, which are channel-shaped depressions 510 in FIGS. 3A and 3B. The channel-shaped depressions 510, whose bottom surfaces are formed by surfaces of the through-contacts 420, generally have a greater depth than the channel-shaped depressions 510, whose bottom surfaces are formed by surfaces of the contact layer 40.

It is possible that the channel-shaped depressions 510 extend from a first edge of the back side 12 to a second edge of the back side 12 opposite the first edge. Such channel-shaped depressions 510 are shown schematically in FIG. 3B. When a component 10 having such channel-shaped depressions 510 is attached to a target surface by a bonding material, excess bonding material along the channel-shaped depressions 510 can be easily guided outwardly.

As a further difference to FIG. 2A, the further sublayer 33 of the insulation structure 3 is formed in such a way that it encapsulates the first sublayer 31 and/or the second sublayer 32 at least in the regions of the openings. In particular, the side walls of the openings are formed exclusively by surfaces of the further sublayer 33. The through-contacts 420 are in particular exclusively directly adjacent to the further sublayer 33 of the insulation structure 3. The contact layer 40 is exclusively adjacent to the further sublayer 33. In other words, there is no direct physical contact between the sublayers 31 and 32 and the contact layer 40 or the through-contacts 420.

Figure 3B:
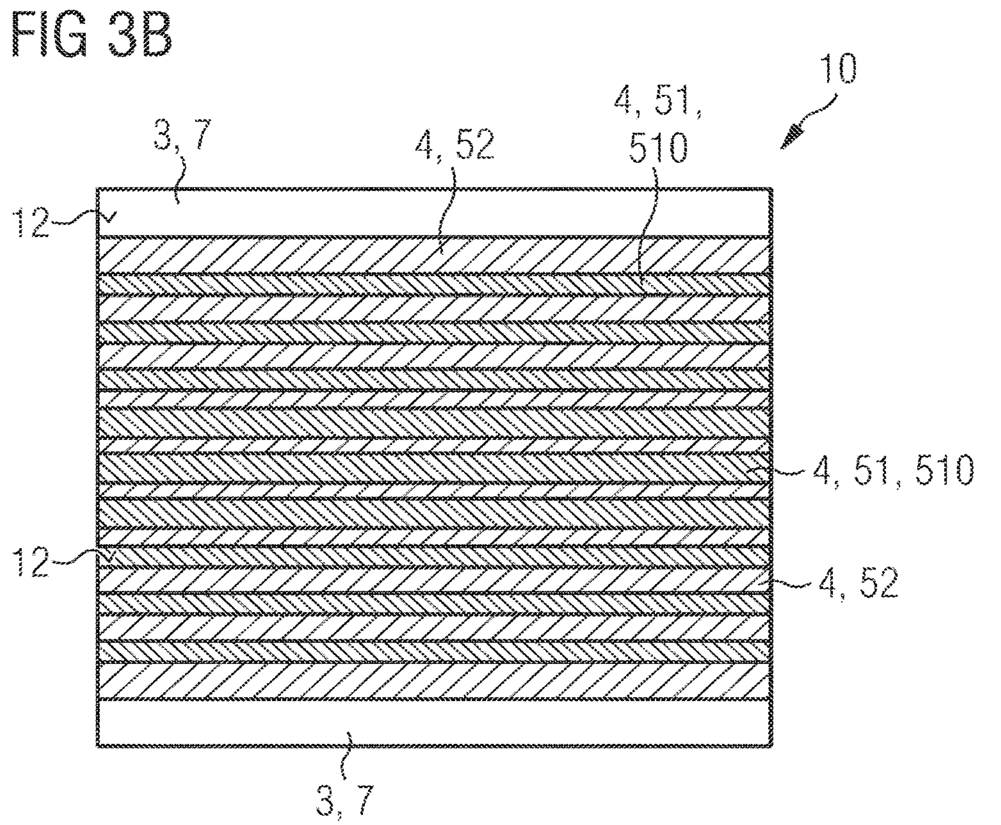

In comparison to FIG. 2B, the back side 12 of the component 10 according to FIG. 3B does not have a widespread exposed region of the insulation structure 3 formed as a holding structure 7. Referring to FIG. 3B, the back side 12 has two holding structures 7 located at two opposite edges of the back side 12 and parallel to the channel-shaped depressions 510. Referring to FIG. 3B, a channel-shaped depression 510 is located between two adjacent local elevations 52 extending parallel to each other. The local elevations 52 form the bars of the bar structure on the back side 12 of the component 10.

Figure 1B:
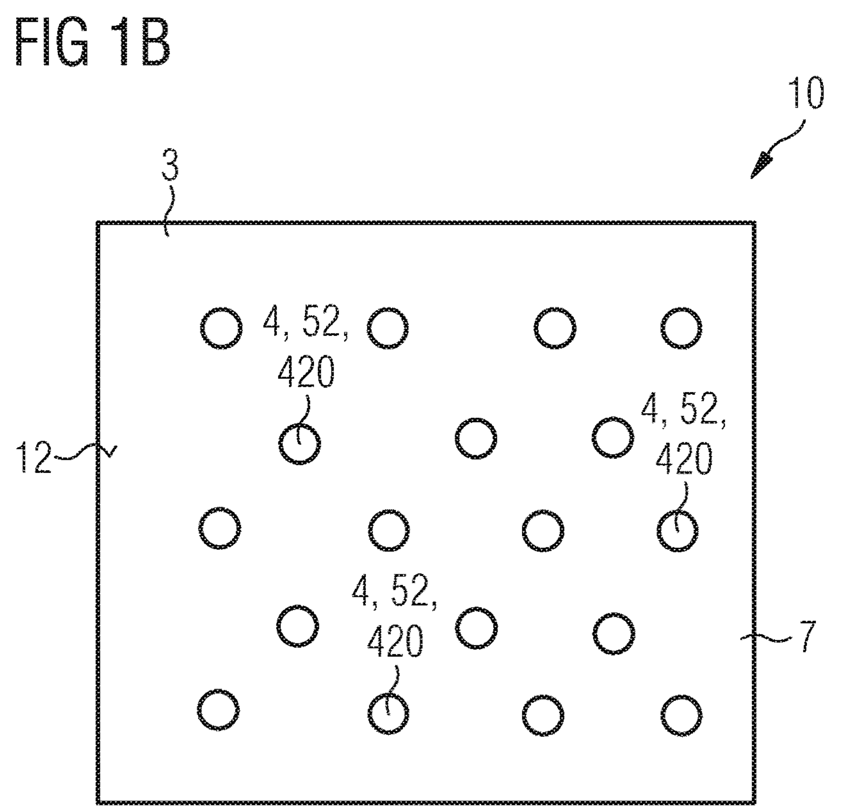

FIGS. 4A, 4B, 4C and 4D show some method steps for producing a component 10, which is schematically shown in particular in FIGS. 1A and 1B.

Figures 4A, 4B:
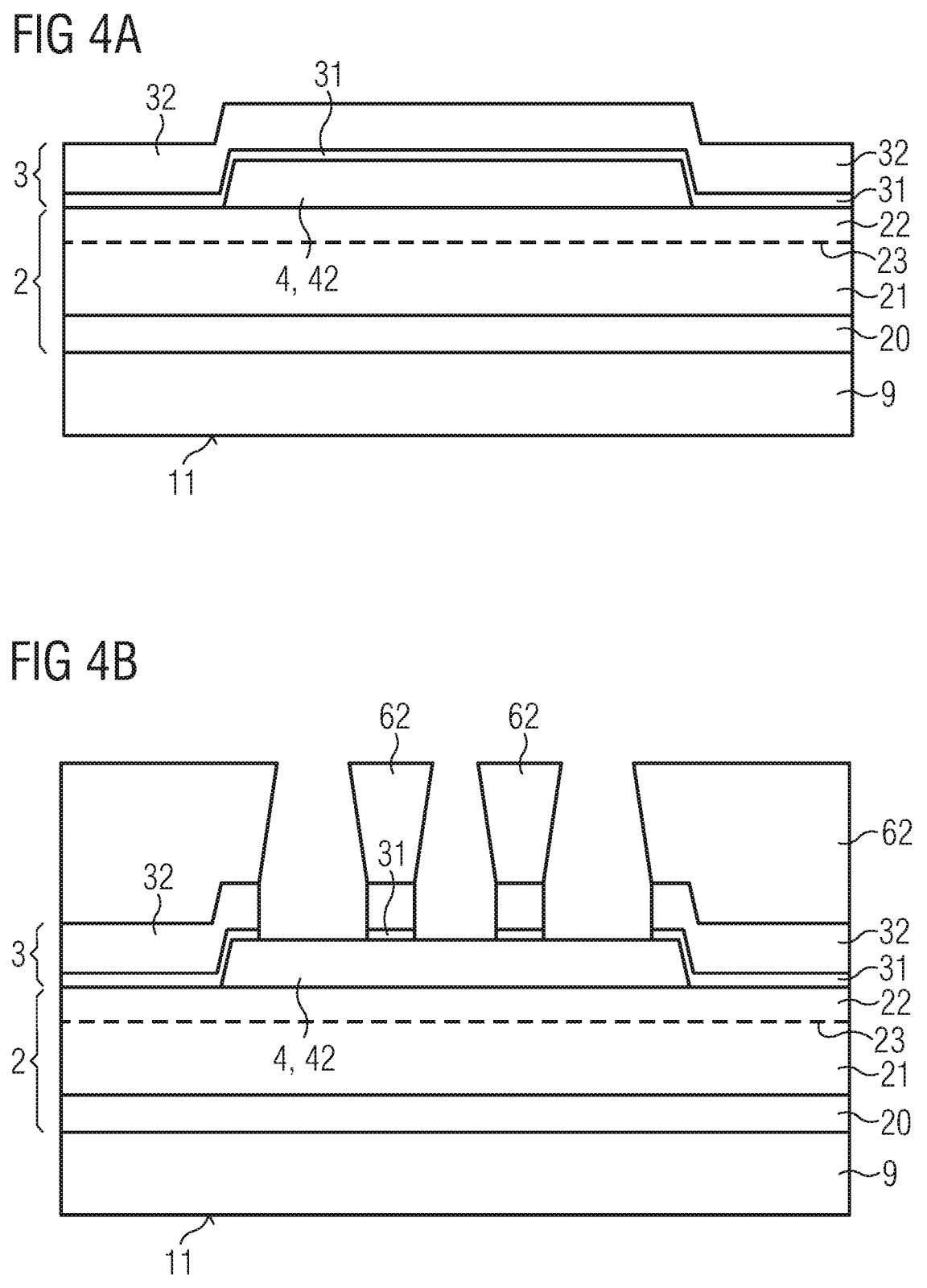

According to FIG. 4A, a semiconductor body 2 is provided on a substrate 9. The semiconductor body 2 comprising a buffer layer 20, a first semiconductor layer 21, an active zone 23 and a second semiconductor layer 22 can be epitaxially grown in the mentioned order layer by layer on the substrate 9, which is in particular a growth substrate.

For electrically contacting the second semiconductor layer 22, a connection layer 42 of a contact structure 4 is formed on the second semiconductor layer 22. For this purpose, a first photolithography layer can be formed by photo-lacquer, which determines the position of the connection layer 42. The connection layer 42 may be formed as a single layer or as a sequence of layers. For example, the connection layer 42 is sputtered on the second semiconductor layer 22. By a lift-off process, the connection layer 42 can be patterned, if necessary.

The second semiconductor layer 22 and the connection layer 42 may be encapsulated, for instance laterally encapsulated, by an insulation structure 3. In particular, a first sublayer 31, for example an Al2O3 layer, and a second sublayer 32, for example an SiO2 layer, of the insulation structure 3 are formed by depositing suitable insulation materials on the semiconductor body 2 and on the connection layer 42. The insulation structure 3 may be formed by a full-area deposition process. For example, the Al2O3 layer is formed by a full-area deposition process, for instance atomic layer deposition (ALD). The SiO2 layer can be formed with the help of TEOS. In particular, due to the full-area deposition or coating, the insulation structure 3, especially the first sublayer 31 or the second sublayer 32, can completely cover the semiconductor body 3 and/or the connection layer 42 in top view.

According to FIG. 4B, for example, a second photolithography layer is formed by a photostructurable material, for instance by negative lacquer. In particular, a mask layer 62 is formed on the insulation structure 3, wherein the mask layer 62 defines the positions of the contact openings, also called vias. The mask layer 62 is a temporary mask layer, in particular a lacquer layer with openings. Using an etching process, for example a dry etching process, for instance RIE, the contact openings are formed throughout the insulation structure 3 for exposing the connection layer 42 in places. The connection layer 42 may serve as an etch stop layer during the etching process.

Figures 4C, 4D:
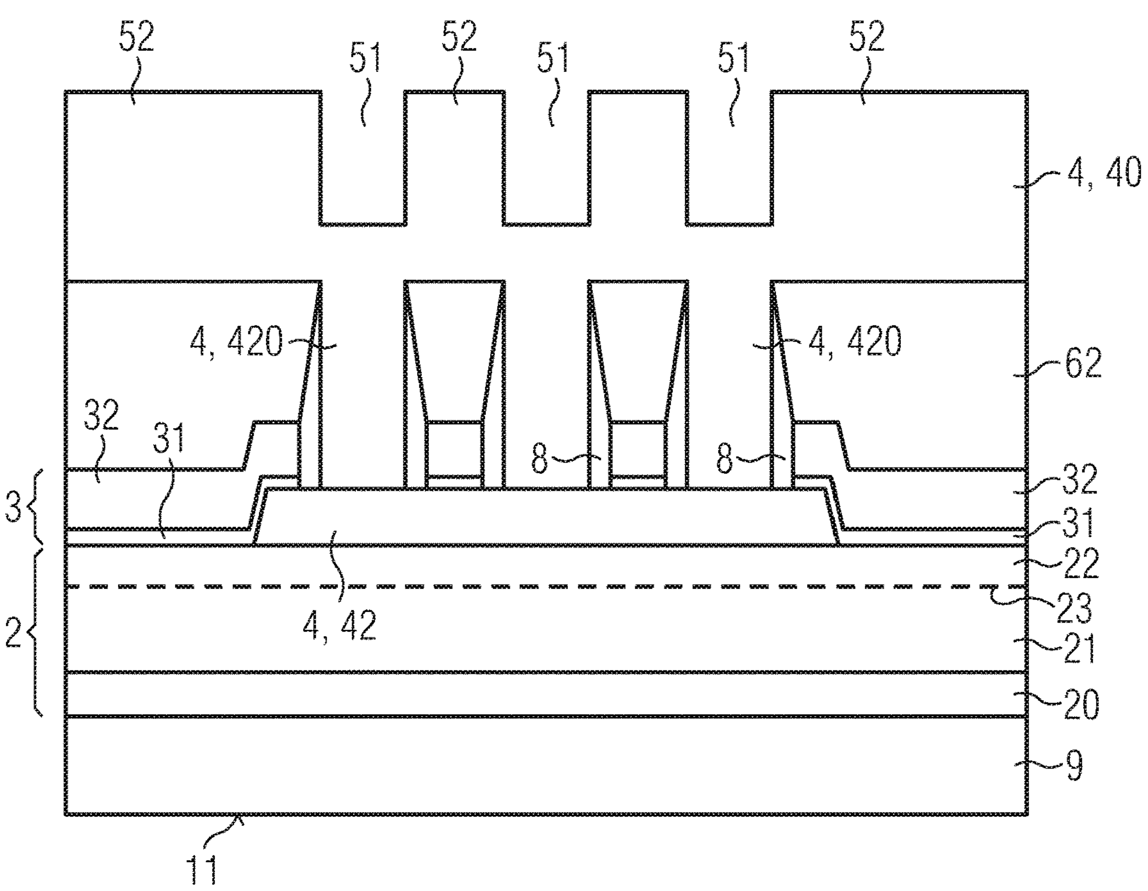

Referring to FIG. 4C, the through-contacts 420 are formed within the contact openings in top view. A contact layer 40 can be formed outside the contact openings. The through-contacts 420 and the contact layer 40 can be formed in a common process step, for example by sputter coating. The contact layer 40 may have local depressions 51 and local elevations 52. The through-contacts 420 and/or the contact layer 40 may be formed of an electrically conductive material, for instance a metal like Ti, Pt, Au, or a transparent electrically conductive oxide like ITO. It is also possible that the through-contacts 420 and/or the contact layer 40 are formed from a layer sequence of several such materials.

According to FIG. 4D, the mask layer 62 is removed. This exposes areas of the insulation structure 3. In particular, the contact layer 40 is also removed so that the through-contacts 420 are formed as individual contact columns, spatially spaced from each other in lateral directions, in the contact openings of the insulation structure 3.

The exemplary embodiment of a component 10 shown in FIG. 4D corresponds to the component 10 shown in FIG. 1A. However, deviating from FIG. 4D, it is also conceivable that the contact layer 40 continues to be present even after the mask layer 62 has been removed, so that the through-contacts 420 are electrically conductively connected to one another via the contact layer 40.

The method described in FIGS. 4A to 4D for producing a component 10 or a plurality of components 10 is characterized in particular in that the photolithography is used to define the contact openings and also to structure the through-contacts 420 and the back side of the component 10, so that the through-contacts 420 are automatically optimally adjusted in the regions of the contact openings, as a result of which undefined topography effects due to possible misalignment of two photo planes can be avoided.

The component 10 produced by this method has a plurality of punctually arranged through-contacts 420. It may therefore prove advantageous if the component 10 connects only punctually on the target mounting surface. This allows the inter-via material, i.e. the bonding material, to be pushed out laterally through the contact gaps. A mechanical and electrical connection between the component 10 and a target substrate having the target mounting surface can thus be established in a simplified and reliable manner. If the component 10 rests on a plurality of through-contacts 420, the risk of tilting when the component 10 is placed on the target substrate is prevented. Electrical current would flow vertically directly across the through-contacts 420 to the connection layer 42. In addition to the connection layer 42, the component 10 is particularly free of a contact layer for lateral current expansion. Due to the point-shaped through-contacts 420 projecting beyond the insulation structure 3, the component 10 is better fixed when deposited on the target substrate than a component with a planar mounting surface.

Figure 5A:
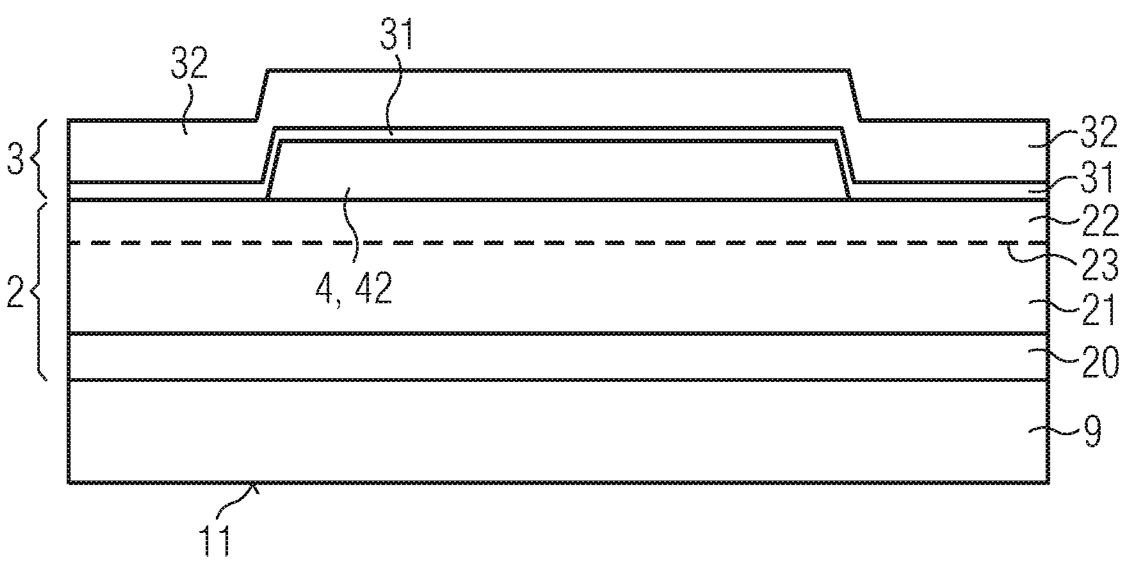
FIGS. 5A, 5B, 5C and 5D schematic representations of some method steps for producing a component, in particular according to the second embodiment.

FIGS. 5A, 5B, 5C and 5D show some method steps for producing a component 10, which is shown schematically in particular in FIGS. 2A and 2B, wherein the exemplary embodiment of a process step shown in FIG. 5A corresponds to the process step shown in FIG. 4A.

Figure 5B:
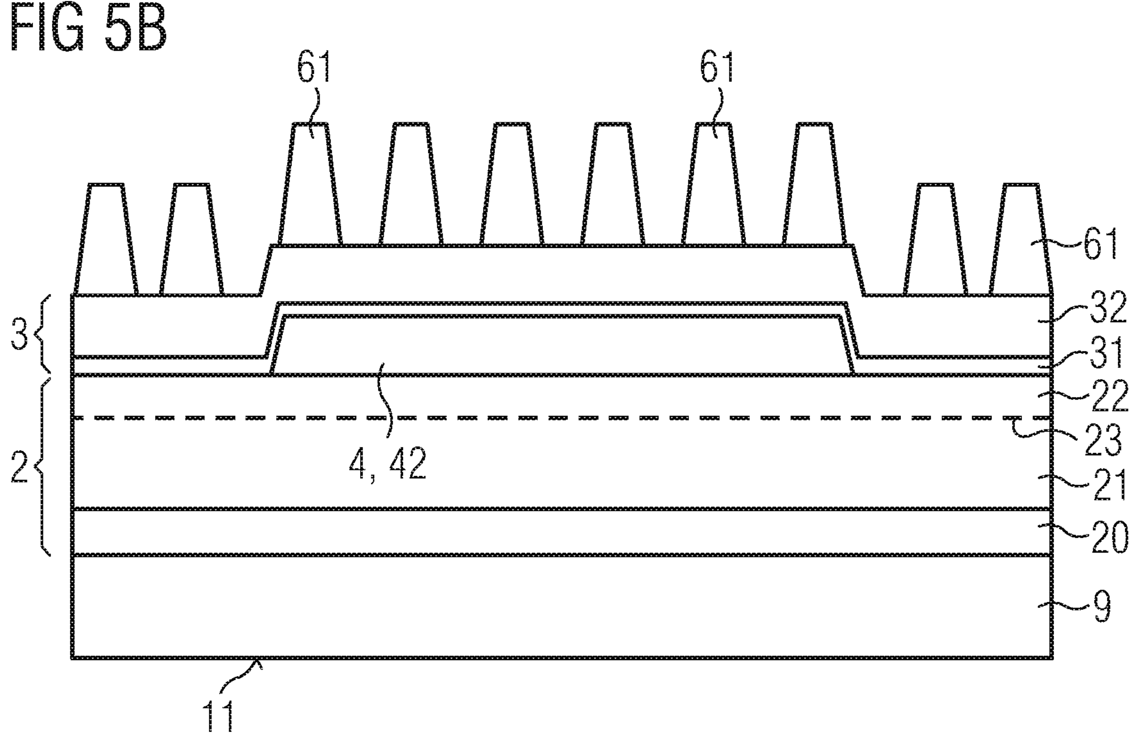

For example, according to FIG. 5B, a second photolithography layer is formed from a photostructurable material, for instance from positive lacquer. In particular, a mask layer 61 is formed on the insulation structure 3, wherein the mask layer 61 defines roughened structures. The roughened structures may be nanostructures. The mask layer 61 is a temporary mask layer, in particular a lacquer layer with openings. Using an etching process, for example RIE, the roughened structures are transferred into the insulation structure 3, in particular into the second sublayer 32 of the insulation structure 3. In this process, material of the second sublayer 32 can be removed in the areas of the openings of the mask layer 61. As a result, the roughened structures, in particular in the form of openings, can be formed in the second sublayer 32. The first sublayer 31 can serve as an etch stop layer during the etching process. In an embodiment, the first sublayer 31 is formed of a material that is more etch resistant than a material of the second sublayer 32. For example, the first sublayer 31 is an Al2O3 layer. The second sublayer 32 may be a SiO2 layer. After transferring the roughened structure or roughened structures, the mask layer 61 is removed.

After removal of the mask layer 61, a further third sublayer 33 is first applied, such as over the entire surface, to the sublayers 31 and 32 of the insulation structure 3, for example by a coating process using TEOS. The further third sublayer 33 may be a $SiO_2$ layer. In top view, the further third sublayer 33 may completely cover the sublayers 31 and/or 32. In particular, the first sublayer 31 is encapsulated by the further third sublayer 33 in the openings of the second sublayer 32. The further third sublayer 33 can be directly adjacent to both the first sublayer 31 and the second sublayer 32.

Figure 5C:
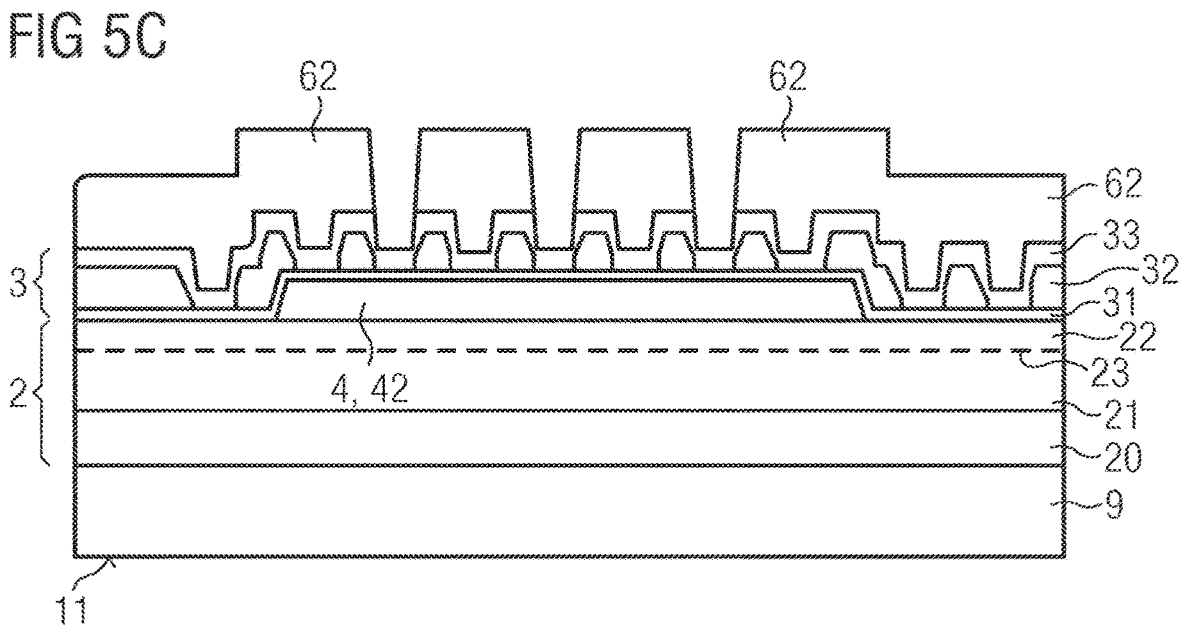

According to FIG. 5C, for example, a third photolithography layer is formed from a photostructurable material, for instance from positive lacquer, which defines the positions of the contact openings. In particular, a mask layer 62 is formed on the insulation structure 3. The mask layer 62 has openings in which contact openings are formed throughout the insulation structure 3, in this case throughout the sublayers 31 and 33. In particular, using an etching process, for example a dry etching process, for instance RIE, the contact openings are formed through the insulation structure 3 to expose the connection layer 42 in regions. The connection layer 42 may serve as an etch stop layer in the etching process. The mask layer 62 may subsequently be removed.

Figure 5D:
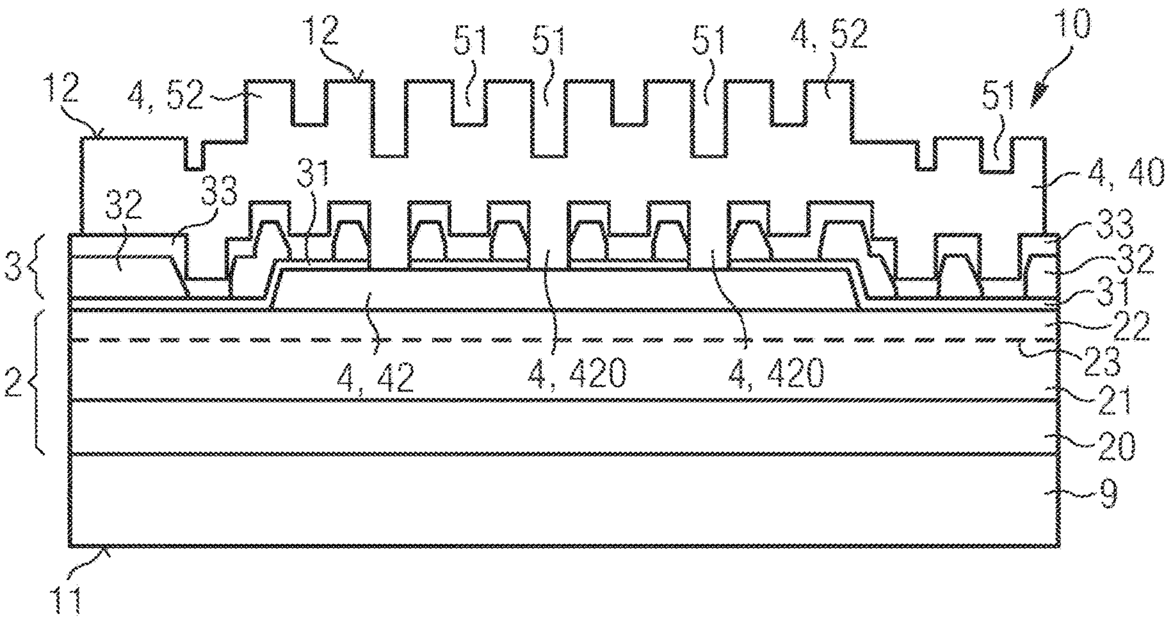

According to FIG. 5D, the mask layer 62 is removed. This exposes the further third sublayer 33 of the insulation structure 3. Outside the contact openings, the roughened structures of the sublayer 32 are reproduced on exposed surfaces of the further sublayer 33. Quite analogously to the process step shown in FIG. 4C, the through-contacts 420 are formed in the contact openings and the contact layer 40 is formed outside the contact openings according to FIG. 5D. Since, in contrast to FIG. 4C, the mask layer 62 is completely removed in FIG. 5D, the roughened structure of the second sublayer 32 is reproduced in particular by applying the material of the contact layer 40 over the entire surface of the exposed surfaces of the further sublayer 33. The exemplary embodiment of a component 10 shown in FIG. 5D corresponds to the component 10 shown in FIG. 2A.

The method for producing a component 10 or a plurality of components 10 described in FIGS. 5A to 5D is characterized in particular by the fact that the roughened structures are initially formed on or in the insulation structure 3 and are subsequently transferred to the connection structure 4 or to the back side 12. The back side 12, which serves as the mounting surface of the component 10, is thus formed to be rough, at least in places, which improves contacting throughout the inter-via material to the target substrate. The electrical connection surface can thus have a large surface area with respect to the back side 12, which minimizes the risk of tilting when the component 10 is placed on the target substrate. In addition, the large number of through-contacts 420 distributed over a large area means that the rough mounting surface is not interrupted over a large area and, at the same time, the electrical connection is optimized.

Figure 6A:
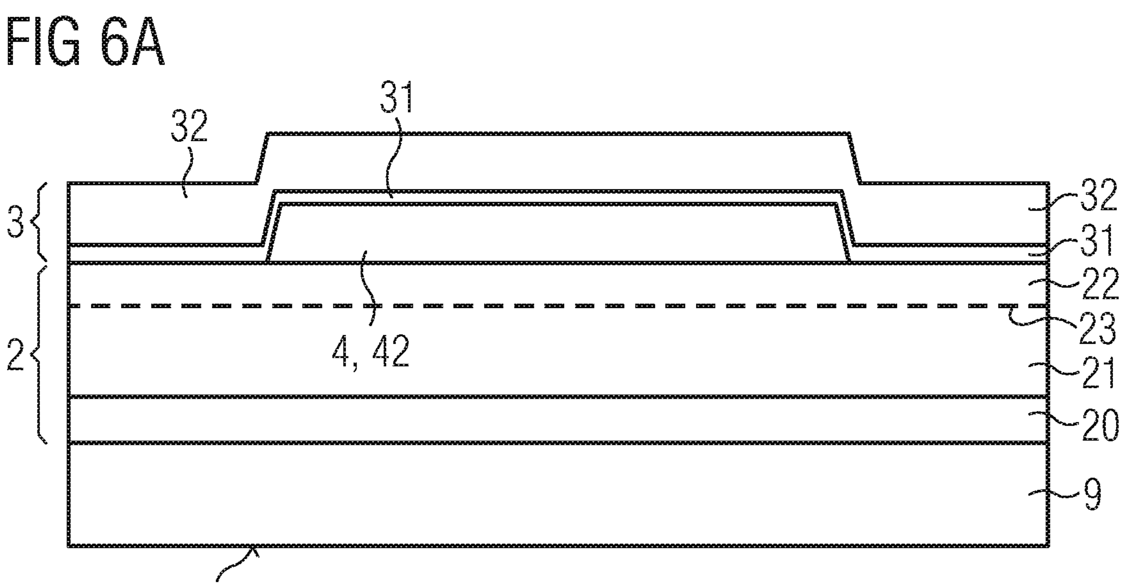
FIGS. 6A, 6B, 6C and 6D show schematic illustrations of some method steps for producing a component, in particular according to the third embodiment.

FIGS. 6A, 6B, 6C and 6D show some process steps for producing a component 10 shown schematically in particular in FIGS. 3A and 3B, wherein the exemplary embodiment of a process step shown in FIG. 6A corresponds to the process step shown in FIG. 4A.

Figure 6B:
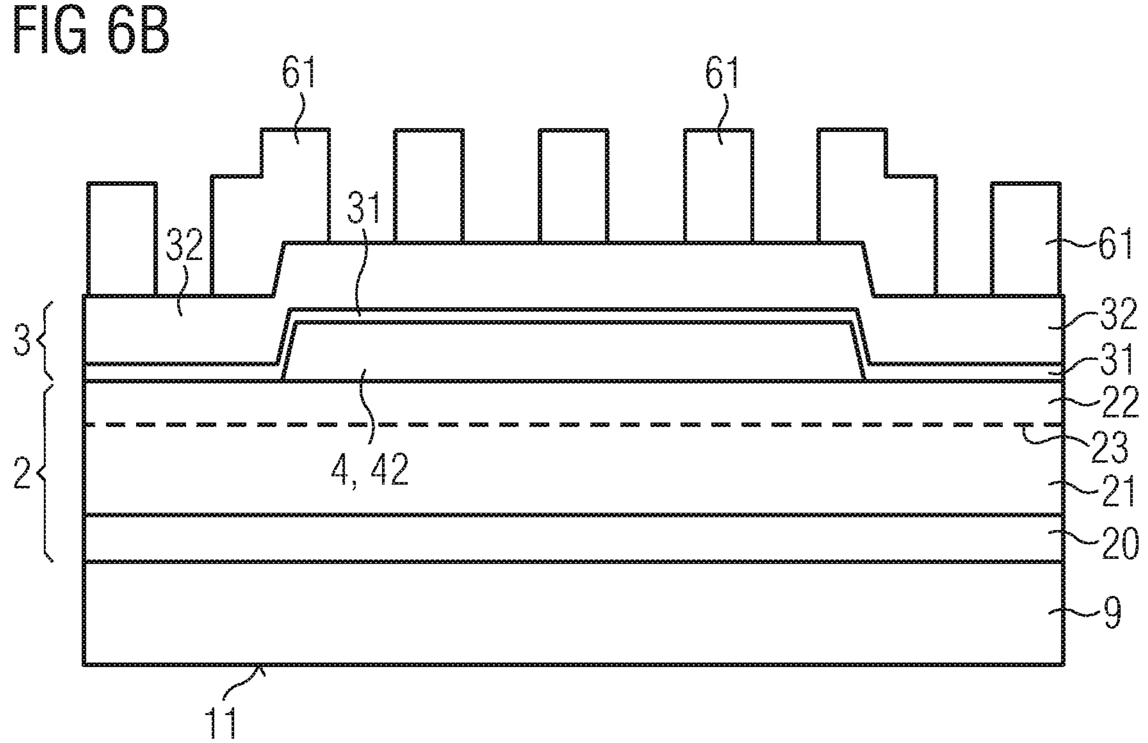

The example of a process step shown in FIG. 6B essentially corresponds to the process step shown in FIG. 5B. Quite analogously to FIG. 5B, according to FIG. 6B, a mask layer 61 is formed on the insulation structure 3, as a result of which the mask layer 61 does not define roughened structures but bar structures.

Using an etching process, for example RIE, the bar structures are transferred into the insulation structure 3, in particular into the second sublayer 32 of the insulation structure 3. Here, material of the sublayer 32 can be removed in the areas of the openings of the mask layer 61. As a result, bar structures, in particular in the form of strip-shaped openings, can be formed in the sublayer 32. The other first sublayer 31 can serve as an etch stop layer during the etching process. In an embodiment, the sublayer 31 is formed of a material that is more etch resistant than a material of the other sublayer 32. For example, the sublayer 31 is an $Al_2O_3$ layer. The sublayer 32 may be a $SiO_2$ layer. After transferring the bar structure or bar structures, the mask layer 61 is removed.

Figure 6C:
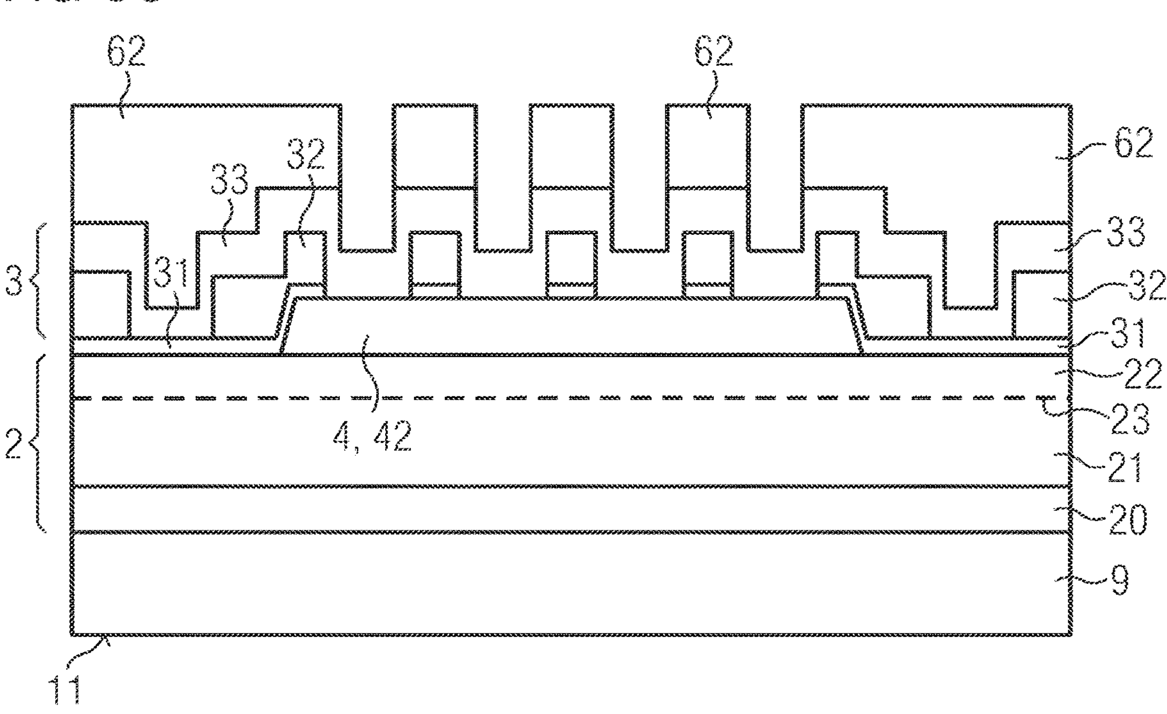

After removal of the mask layer 61, as shown in FIG. 6C, a further third sublayer 33 of the insulation structure 3 is first applied, such as over the entire surface, to the sublayers 31 and 32 of the insulation structure 3, for example by a coating process using TEOS. The further sublayer 33 can be a $SiO_2$ layer. In top view, the further sublayer 33 completely covers the sublayers 31 and/or 32 and thus encapsulates the sublayers 31 and 32. The further third sublayer 33 adjoins, in particular directly adjoins both the first sublayer 31 and the second sublayer 32.

Quite analogously to FIG. 5C, a third photolithography layer is formed according to FIG. 6C, in particular from a photostructurable material, for instance from positive lacquer, which defines the positions of the contact openings. A mask layer 62 is formed on the insulation structure 3. The mask layer 62 has openings in which contact openings are formed through the insulation structure 3, in this case only throughout the third sublayer 33. In particular, using an etching process, for example using a dry etching process, for instance RIE, the contact openings are formed through the insulation structure 3 for exposing the connection layer 42 in regions. The connection layer 42 can serve as an etch stop layer during the etching process.

Figure 6D:
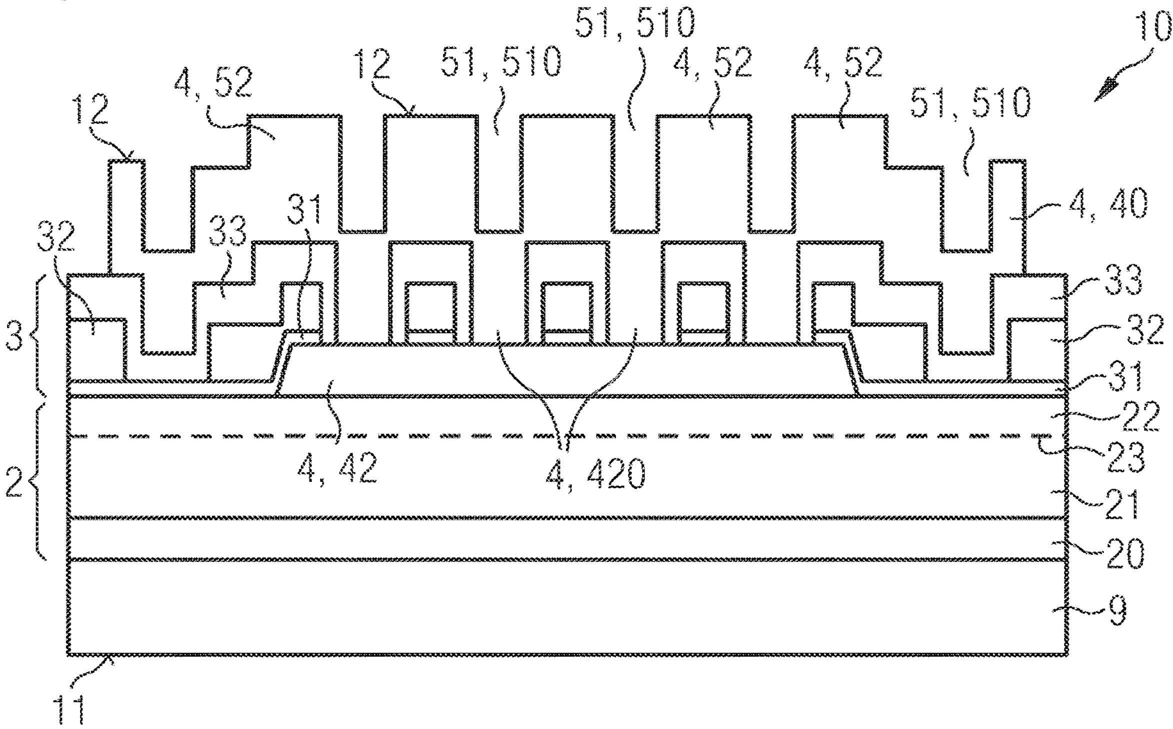

According to FIG. 6D, the mask layer 62 is removed. This exposes the third sublayer 33 of the insulation structure 3. Outside the contact openings, the bar structures of the sublayer 32 are reproduced on exposed surfaces of the further sublayer 33. Quite analogously to the process step shown in FIG. 5D, the through-contacts 420 are formed in the contact openings and the contact layer 40 is formed outside the contact openings according to FIG. 6D. In particular, by applying the material of the contact layer 40 over the entire surface of the exposed surfaces of the third sublayer 33, the bar structure of the second sublayer 32 on the back side 12 of the component 10 is reproduced. The exemplary embodiment of a component 10 shown in FIG. 6D corresponds to the component 10 shown in FIG. 3A.

The method for producing a component 10 or a plurality of components 10 described in FIGS. 6A to 6D is characterized in particular in that the bar structures are first formed on or in the insulation structure 3 and subsequently transferred to the connection structure 4 or to the back side 12. The back side 12, which serves as the mounting surface of the component 10, thus has bar-shaped structures, which simplifies and improves contacting through the inter-via material to the target substrate, since the interconnect material can be more easily pressed to the outward when the component 10 is attached to the target substrate. This optimizes the area and reliability of the electrical connection. When the component 10 is placed on the target substrate with lateral shearing motion, the bar-shaped structure acts as a kind of anchor structure and reduces the risk of misalignment.

In all embodiments of a method for producing a component 10, further process steps may be applied. Such further process steps include, for example, steps for defining a support structure, applying a release sacrificial layer, bonding on a temporary support, laser lift-off (LLO), n-contact deposition, mesa etch, passivation, release etch, and pick-and-place on a target mounting surface.

In all embodiments of a component 10, it is also possible that the substrate 9 is removed from the semiconductor body 2. In this case, the component 10 is free of a substrate 9, in particular free of a growth substrate. The buffer layer 20 exposed by the removal of the substrate 9 may be roughened or patterned, so that the efficiency of the component 10 with respect to light extraction or light injection is improved.

This patent application claims the priority of the German patent application 10 2020 123 386.8, the disclosure content of which is hereby included by reference.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

LIST OF REFERENCE SIGNS

10 Component
11 Front side/radiation-transmissive surface of the component
12 Back side/mounting surface of the component
2 Semiconductor body
20 Buffer layer
21 First semiconductor layer
22 Second semiconductor layer
23 Active zone
3 Insulation structure
31 Sublayer of the insulation structure
32 Sublayer of the insulation structure
33 Sublayer of the insulation structure
4 Connection structure
40 Contact layer
42 Connection layer/connection layer sequence
420 Through-contacts
51 Local depression
510 Channel-shaped depression
52 Local elevation
61 Mask layer/temporary mask layer/lacquer layer
62 Mask layer/further mask layer/lacquer layer
7 Holding structure
8 Intermediate region
9 Substrate

The invention claimed is:

1. A component comprising a semiconductor body, an insulation structure, and a connection structure; wherein:

the semiconductor body comprises a first semiconductor layer, a second semiconductor layer and an active zone located therebetween, the connection structure has a connection layer in direct electrical contact with the second semiconductor layer, the insulation structure adjoins both the second semiconductor layer and the connection layer, wherein the insulation structure laterally surrounds and, in top view, partially covers the connection layer, the component has a back side being a mounting surface, which is structured and formed, at least in regions, by surfaces of the connection structure, the connection structure has through-contacts in electrical contact with the connection layer and extend throughout the insulation structure along a vertical direction, the back side is formed to be freely accessible and structured and has local depressions as well as local elevations, the local elevations are parts of the connection structure and different from the through-contacts, the local elevations are bar-shaped, so that those local depressions located between two adjacent local elevations each form a channel-shaped structure on the back side, and the insulation structure has openings on the connection layer in which the through-contacts are located, the through-contacts projecting beyond the insulation structure along the vertical direction, being spaced apart from the insulation structure in lateral directions by an intermediate region or intermediate regions and being exposed at the back side of the component.

2. The component according to claim 1, wherein the back side has the local depressions or the local elevations, the surfaces of which are at least partially formed by surfaces of the through-contacts.

3. The component according to claim 1, wherein the through-contacts are spatially spaced apart from one another along the lateral direction, the through-contacts being formed as individual contact columns of the component electrically conductively connected to one another exclusively via the connection layer.

4. The component according to claim 1, wherein the back side has the local depressions whose bottom surfaces are at least partially formed by surfaces of the through-contacts.

5. The component according to claim 1, wherein the connection structure has a continuous contact layer, the through-contacts being formed as integral parts of the continuous contact layer.

6. The component according to claim 1, wherein the back side is formed to be freely accessible and structured, and has the local depressions as well as the local elevations, wherein:

the local elevations are parts of the connection structure and different from the through-contacts, and at least 50 percent of the total area of the back side is formed by a roughened or bar-shaped surface of the connection structure.

7. The component according to claim 1, wherein the connection layer is radiation-reflective.

8. The component according to claim 1, further comprising a radiation-transmissive substrate, wherein a front side of the component is formed by a surface of the radiation-transmissive substrate and is formed as a radiation-transmissive surface of the component.

9. The component according to claim 1, wherein the insulation structure is a multilayer structure and has at least two different directly adjacent sublayers having different material compositions, at least one of the sublayers being structured and having a roughened structure or a bar structure, and the roughened structure or the bar structure being reproduced on the back side of the component.

10. The component according to claim 1, wherein the through-contacts are formed as individual, one-piece contact columns, are arranged in openings of the insulation structure on the connection layer, project beyond the insulation structure along the vertical direction, and are freely accessible at the back side of the component, or the connection structure has a continuous contact layer, the through-contacts being formed as integral parts of the continuous contact layer, the back side having local depressions whose bottom surfaces are at least partially formed by surfaces of the through-contacts.

11. The component according to claim 9, wherein the at least two different directly adjacent sublayers comprise a first sublayer, a second sublayer and a third sublayer, wherein openings are formed in the second sublayer for transferring the roughened structure or the bar structure into the second sublayer, the first sublayer and the second sublayer have different material compositions, the third sublayer is formed on the second sublayer, which is patterned, and on the first sublayer, the third sublayer is directly adjacent to both the first sublayer and the second sublayer, and the roughened structure or the bar structure is reproduced on a surface of the third sublayer facing away from the semiconductor body.

12. A method for producing a component, wherein the method comprises:

A) providing a semiconductor body having a first semiconductor layer, a second semiconductor layer, and an active zone located therebetween;

B) forming a connection layer in direct electrical contact with the second semiconductor layer;

C) forming an insulation structure adjacent to both the second semiconductor layer and the connection layer, the insulation structure laterally surrounding and-in top view-completely covering the connection layer;

D) structuring the insulation structure to partially expose the connection layer so that in top view, the insulation structure only partially covers the connection layer; and E) applying through-contacts into exposed regions of the connection layer for forming the connection structure, the through-contacts being in electrical contact with the connection layer and along a vertical direction, extending throughout the insulation structure so that the component has a back side being a mounting surface, which is formed in a structured manner and is formed at least in regions by surfaces of the through-contacts, wherein the insulation structure comprises a first sublayer and a second sublayer, wherein openings are formed in the second sublayer to transfer a roughened structure or a bar structure into the second sublayer, the roughened structure or the bar structure being subsequently reproduced on the back side of the component, and wherein the method further comprises:

forming the openings in the second sublayer via a temporary mask layer that is subsequently removed, applying a third sublayer of the insulation structure onto the second structured sublayer and/or onto the first sublayer, as a result of which the roughened structure or the bar structure is reproduced on a surface of the third sublayer facing away from the semiconductor body, forming a further mask layer having openings on the third sublayer, wherein contact openings are formed in the openings of the further mask layer and extend throughout the first sublayer of the insulation structure to the connection layer, and forming a continuous contact layer of the connection structure, wherein through- contacts are formed in the contact openings and as integral parts of the continuous contact layer, and the roughened structure or the bar structure is reproduced on a surface of the continuous contact layer facing away from the semiconductor body.

13. The method according to claim 12, further comprising applying a temporary and removable layer onto the insulation structure, and forming a mask layer by forming openings in the temporary and removable layer.

14. The method according to claim 13, wherein the temporary and removable layer is a lacquer layer formed from a photostructurable negative lacquer or from a photostructurable positive lacquer, wherein the lacquer layer is photo-structured to form the mask layer.

15. The method according to claim 13, further comprising forming contact openings in the openings of the mask layer that extend throughout the insulation structure to the connection layer, and forming through-contacts in the contact openings before the mask layer is removed.

16. The method according to claim 15, wherein the contact openings are formed by an etching process in which the connection layer serves as an etch stop layer.

17. The method according to claim 12, wherein the first sublayer and the second sublayer have different material compositions, the first sublayer being formed to be more etch-resistant than the second sublayer, wherein the openings in the second sublayer are formed by an etching process in which the first sublayer serves as an etch stop layer.

18. The method according to claim 12, wherein the through-contacts are formed as individual, one-piece contact columns, are arranged in openings of the insulation structure on the connection layer, project beyond the insulation structure along the vertical direction and are freely accessible at the back side of the component.

19. The method according claim 12, wherein the back side has local depressions whose bottom surfaces are at least partially formed by surfaces of the through-contacts.

* * * * *